(12) United States Patent
Feng et al.

(10) Patent No.: US 10,825,539 B2
(45) Date of Patent: Nov. 3, 2020

(54) SHIFT REGISTER UNIT, GATE DRIVING CIRCUIT, DISPLAY APPARATUS AND DRIVING METHOD

(71) Applicants: Hefei Xinsheng Optoelectronics Technology Co., Ltd., Anhui (CN); BOE Technology Group Co., Ltd., Beijing (CN)

(72) Inventors: Xuehuan Feng, Beijing (CN); Yongqian Li, Beijing (CN)

(73) Assignees: Hefei Xinsheng Optoelectronics Technology Co., Ltd., Hefei, Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/385,699

(22) Filed: Apr. 16, 2019

(65) Prior Publication Data

US 2020/0035316 A1    Jan. 30, 2020

(30) Foreign Application Priority Data

Jul. 27, 2018    (CN) .......................... 2018 1 0852378

(51) Int. Cl.
*G11C 19/28*    (2006.01)
*G11C 19/00*    (2006.01)
*G09G 3/3208*    (2016.01)

(52) U.S. Cl.
CPC ......... *G11C 19/287* (2013.01); *G09G 3/3208* (2013.01); *G11C 19/00* (2013.01);
(Continued)

(58) Field of Classification Search
CPC .............. G09G 3/3208; G09G 3/3266; G09G 2300/0426; G09G 2310/08;
(Continued)

(56) References Cited

U.S. PATENT DOCUMENTS

2017/0069283 A1*    3/2017    You ...................... G11C 19/184
2017/0076683 A1*    3/2017    Lee ........................ G11C 19/28
(Continued)

FOREIGN PATENT DOCUMENTS

CN    109935185 A    6/2019
KR    20170078978 A    7/2017

OTHER PUBLICATIONS

Jul. 29, 2019—(CN) First Office Action Appn 201810852378.2 with English Translation.

*Primary Examiner* — Brent D Castiaux
(74) *Attorney, Agent, or Firm* — Banner & Witcoff, Ltd.

(57) ABSTRACT

Disclosed are a shift register unit, a gate driving circuit, a display apparatus and a driving method. The shift register unit includes: a first input sub-circuit, configured to receive a display input signal from a display input terminal, and input a display output control signal to a first node in a display period of one frame according to the display input signal; a second input sub-circuit, configured to receive a random input signal in the display period of one frame, and input a blanking output control signal to the first node in a blanking period of one frame according to the random input signal; and an output sub-circuit, configured to output a composite output signal via an output terminal under the control of the first node.

20 Claims, 12 Drawing Sheets

(52) U.S. Cl.
CPC ............... *G09G 2300/0426* (2013.01); *G09G 2310/0286* (2013.01); *G09G 2310/08* (2013.01)

(58) Field of Classification Search
CPC ............ G09G 2310/0286; G11C 19/00; G11C 19/287; G11C 19/28
See application file for complete search history.

(56) References Cited

U.S. PATENT DOCUMENTS

2017/0092179 A1* 3/2017 Lee ...................... G09G 3/2048
2018/0337682 A1* 11/2018 Takasugi ............... G09G 3/3241

* cited by examiner

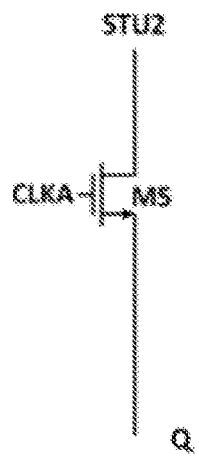
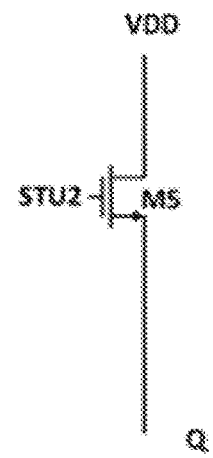
Fig.2a          Fig.2b
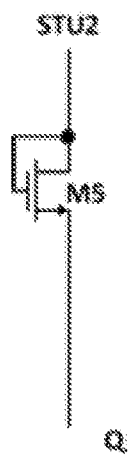
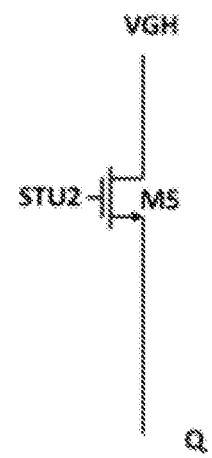
Fig.2c          Fig.2d
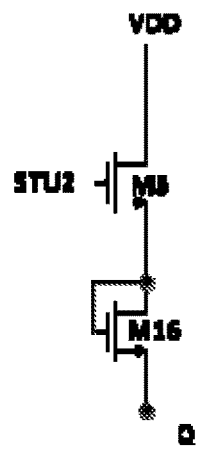
Fig.2e

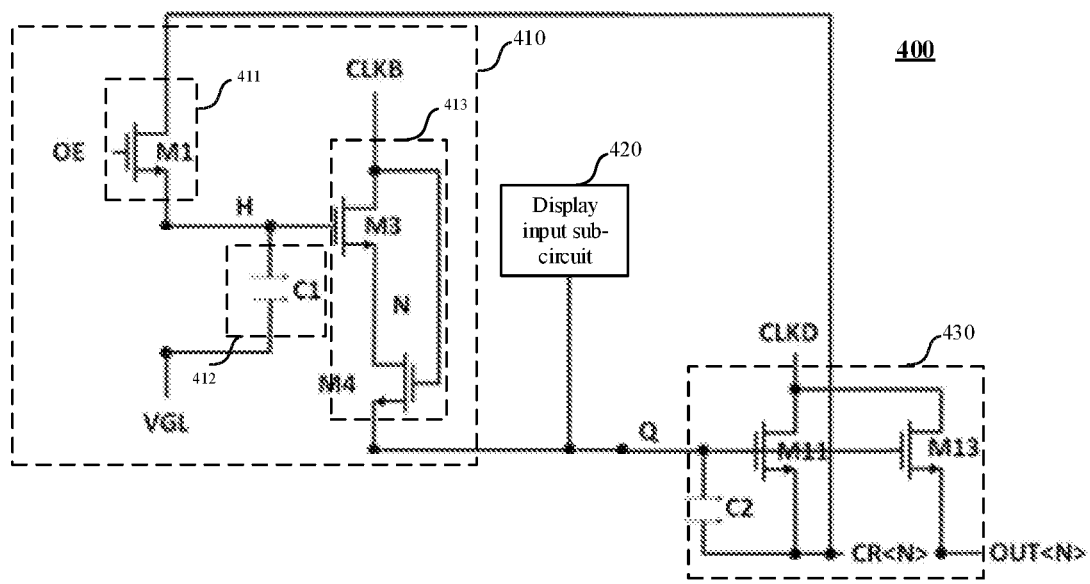
Fig.5a
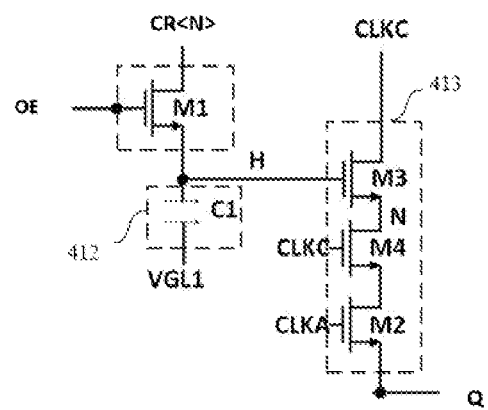
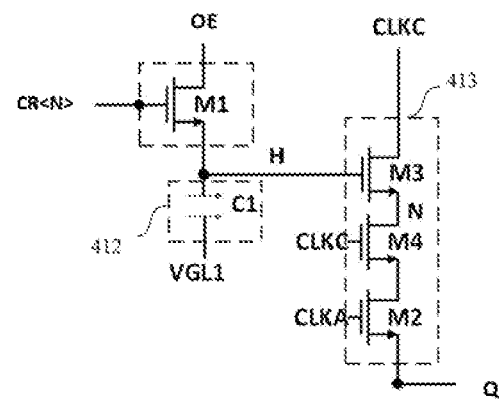
Fig. 5b
Fig. 5c

SHIFT REGISTER UNIT, GATE DRIVING CIRCUIT, DISPLAY APPARATUS AND DRIVING METHOD

CROSS-REFERENCE TO RELATED APPLICATION

The present application claims priority of Chinese Patent Application No. 201810852378.2 filed on Jul. 27, 2018, the disclosure of which is incorporated herein by reference in its entirety as part of the present application.

TECHNICAL FIELD

The present disclosure relates to a shift register unit, a gate driving circuit comprising the shift register unit, a display apparatus and a driving method applicable to the shift register unit.

BACKGROUND

In a display, in particular in OLED display field, a gate driving circuit is currently integrated in an integrated circuit. In a design of the integrated circuit, an area of a chip is a major cause that influences cost of the chip. Therefore, it needs to be considered emphatically by technical developers how to reduce the area of the chip effectively.

SUMMARY

There is provided in the present disclosure a shift register unit, a gate driving circuit and a driving method thereof.

According to one aspect of the present disclosure, there is provided a shift register unit, comprising: a first input sub-circuit, configured to receive a display input signal from a display input terminal, and input a display output control signal to a first node in a display period of one frame according to the display input signal; a second input sub-circuit, configured to receive a random input signal in the display period of one frame, and input a blanking output control signal to the first node in a blanking period of one frame according to the random input signal; and an output sub-circuit, configured to output a composite output signal via an output terminal under the control of the first node.

In some embodiments, the random input signal is a pulse signal inputted within one random clock cycle during the display period.

In some embodiments, the second input sub-circuit comprises: a charging sub-circuit, configured to charge a blanking control node according to the random input signal; a storage sub-circuit, connected to the blanking control node and configured to store a blanking control signal according to the random input signal; an isolation sub-circuit, configured to input the blanking output control signal to the first node according to the blanking control signal in the blanking period of one frame.

In some embodiments, the shift register unit further comprises a display reset sub-circuit, configured to reset the first node under the control of a display reset control signal.

In some embodiments, the shift register unit further comprises a blanking reset sub-circuit, configured to reset the blanking control node and the first node under the control of a blanking reset control signal before the blanking period of one frame ends up.

In some embodiments, the output sub-circuit comprises at least one shift signal output terminal and at least one pixel signal output terminal.

In some embodiments, the shift register unit further comprises a pull-down control sub-circuit, configured to control a potential of a pull-down node according to the first node; and a pull-down sub-circuit, configured to pull down the first pull-up node and the output terminal to a non-operating potential under the control of the pull-down node.

In some embodiments, the charging sub-circuit comprises a charging transistor, having a first electrode connected to the output terminal, a control electrode input by the random input signal, and a second electrode connected to the blanking control node; and the storage sub-circuit comprises a first capacitor, having a first terminal connected to the blanking control node; and the isolation sub-circuit comprises a first isolation transistor and a second isolation transistor, wherein a control terminal of the first isolation transistor is connected to the blanking control mode, and the second isolation transistor has a first electrode connected to a second electrode of the first isolation transistor, a second electrode connected to the first node, and a control electrode connected to an isolation control signal line.

In some embodiments, the first input sub-circuit comprises a display input transistor, having a first electrode connected to the first node, a second electrode and/or control electrode connected to the display input terminal; the output sub-circuit comprises an output transistor and an output capacitor, wherein the output transistor has a first electrode connected to an output clock signal line, a second electrode connected to the output terminal, and a control electrode connected to the first node, and the output capacitor has a first terminal connected to the first node, and a second terminal connected to the output terminal.

In some embodiments, the display reset sub-circuit comprises a display reset transistor, having a first electrode connected to the first node, a control electrode connected to a display reset control terminal, and a second electrode connected to a display reset signal line.

In some embodiments, the blanking reset sub-circuit comprises a first blanking reset transistor and a second blanking reset transistor, wherein the first blanking reset transistor has a first electrode connected to the blanking control node, a control electrode connected to a blanking reset control terminal, and a second electrode connected to a first blanking reset signal line, and the first blanking reset transistor is configured to reset the blanking control node under the control of a blanking reset control signal; and the second blanking reset transistor has a first electrode connected to the first node, a control electrode connected to the blanking reset control terminal, and a second electrode connected to a second blanking reset signal line, and the second blanking reset transistor is configured to reset the first node under the control of the blanking reset control signal.

In some embodiments, the pull-down control sub-circuit comprises a first pull-down control transistor and a second pull-down control transistor, wherein a first electrode of the first pull-down control transistor is connected with a control electrode of the first pull-down control transistor, and is connected to a pull-down control signal line, and a second electrode of the first pull-down control transistor is connected to a pull-down node, and a first electrode of the second pull-down control transistor is connected to the pull-down node, a control electrode of the second pull-down control transistor is connected to the first node, and a second electrode of the second pull-down control transistor is connected to a pull-down signal line; the pull-down sub-circuit comprises a first pull-down transistor and a second pull-down transistor, wherein a first electrode of the first pull-down transistor is connected to the first node, a control electrode of the first pull-down transistor is connected to the pull-down node, and a second electrode of the first pull-down transistor is connected to the pull-down signal line, and a first electrode of the second pull-down transistor is connected to the output terminal, a control electrode of the second pull-down transistor is connected to the pull-down node, and a second electrode of the second pull-down transistor is connected to the pull-down signal line.

According to another aspect of the present disclosure, there is further provided a gate driving circuit, comprising N rows of shift register units connected in cascades, the shift register unit being the shift register unit as described above, wherein a display input terminal of an i-th stage of shift register unit is connected to an output terminal of an (i−1)-th stage of shift register unit, and an output terminal of the i-th stage of shift register unit is connected to a display reset terminal of the (i−1)-th stage of shift register unit, where N is an integer greater than 2, $1<i\leq N$; a display input terminal of a first stage of shift register unit is connected to a display signal line; and a display reset control terminal of an N-th stage of shift register unit is connected to a display reset signal line.

According to another aspect of the present disclosure, there is further provided a display apparatus, comprising the gate driving circuit as described above.

According to another aspect of the present disclosure, there is further provided a driving method applicable to the shift register unit as described above, comprising: during a display period of one frame, in a first control phase, inputting, via a first input sub-circuit, a display output control signal to a first node; in a first output phase, outputting, via an output sub-circuit, a first output signal under the control of the first node; wherein in the first output phase, receiving, via a second input sub-circuit, a random input signal, and charging a blanking control node under the control of the random input signal; and during a blanking period of one frame, in a second control phase, inputting, via a second input sub-circuit, a blanking output control signal to the first node; in a second output phase, outputting, via an output sub-circuit, a second output signal under the control of the first node.

In some embodiments, the driving method further comprises: in a display reset phase, resetting the first node under the control of a display reset control signal.

In some embodiments, the driving method further comprises: a blanking reset phase, resetting the first node and the blanking control node under the control of a blanking reset control signal.

The shift register unit provided according to the present disclosure can realize random scanning compensation in the gate driving circuit, so as to solve negative influence caused by implementation of pixel compensation by means of progressive scanning in the existing shift register unit.

BRIEF DESCRIPTION OF THE DRAWINGS

In order to describe technical solutions of embodiments of the present disclosure more clearly, accompanying figures needed to be used in the description of the embodiments will be introduced below briefly. Obviously, the figures in the following description are just some embodiments of the present disclosure. For those ordinary skilled in the art, other figures can also be obtained from these figures, without paying any inventive labor. The following figures are not purposely drawn by scaling in proportion according to the actual dimensions, because the key point is to show the substance and spirit of the present disclosure.

FIG. 2a shows a first exemplary circuit structure of a display input sub-circuit according to some embodiments of the present disclosure;

FIG. 2b shows a second exemplary circuit structure of a display input sub-circuit according to some embodiments of the present disclosure;

FIG. 2c shows a third exemplary circuit structure of a display input sub-circuit according to some embodiments of the present disclosure;

FIG. 2d shows a fourth exemplary circuit structure of a display input sub-circuit according to some embodiments of the present disclosure;

FIG. 2e shows a fifth exemplary circuit structure of a display input sub-circuit according to some embodiments of the present disclosure;

FIG. 5a shows a first exemplary circuit structure of a blanking input sub-circuit according to some embodiments of the present disclosure;

FIG. 5b shows a second exemplary circuit structure of a blanking input sub-circuit according to some embodiments of the present disclosure;

FIG. 5c shows a third exemplary circuit structure of a blanking input sub-circuit according to some embodiments of the present disclosure;

DETAILED DESCRIPTION

Figure 1:
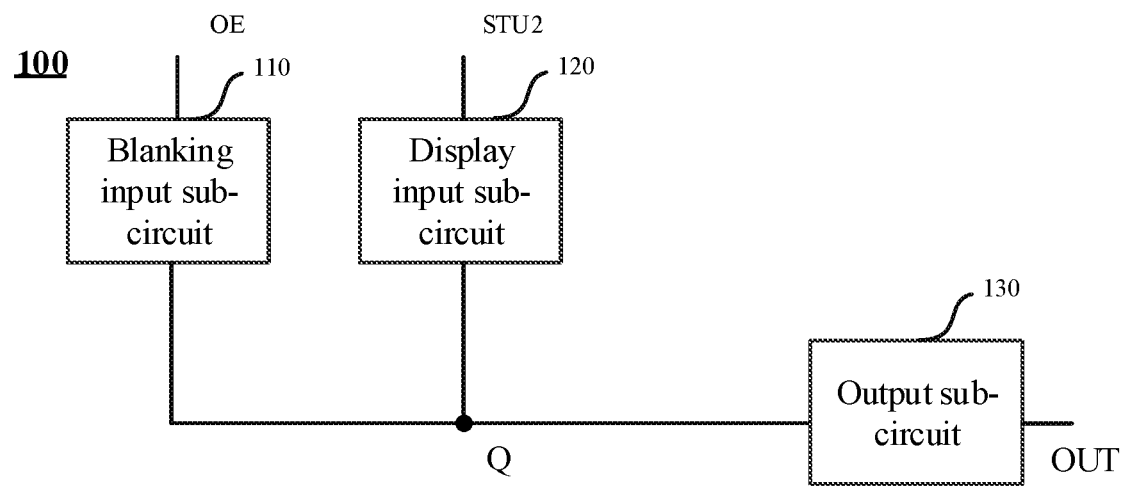
FIG. 1 shows a schematic block diagram of a structure of a shift register unit according to some embodiments of the present disclosure.

Technical solutions in embodiments of the present disclosure will be described below clearly and completely by combining with accompanying figures. Obviously, the embodiments described below are just a part of embodiments of the present disclosure, but not all the embodiments.

Based on the embodiments of the present disclosure, all the other embodiments obtained by those ordinary skilled in the art without paying any inventive labor also fall into the scope sought for protection in the present disclosure.

"First", "second" and similar words used in the present disclosure do not indicate any sequence, quantity or importance, but they are just used to distinguish different components. Also, "include", "comprise" and other similar words mean that an element or an object appearing prior to the word contains an element or an object or its equivalent listed subsequent to the word, but does not exclude other elements or objects. "Connect", "connected to" and other similar words are not limited to physical or mechanical connection, but can comprise electrical connection, regardless of direct connection or indirect connection. "Up", "down", "left", "right" and so on are used to only indicate a relative position relationship. After an absolute position of a described object is changed, the relative position relationship is likely to be changed correspondingly.

As disclosed in the specification and Claims of the present disclosure, unless otherwise explicitly indicating an exception in the context, "a", "one", "a kind of" and/or "the" and other words do not specifically refer to a singular number, but can also comprise a complex number. Generally speaking, terms of "include" and "comprise" only indicate to comprise those explicitly identified elements and steps, while these steps and elements do not form an exclusive list, and a method or a device is also likely to comprise other steps or elements.

Transistors adopted in all the embodiments of the present disclosure can be thin film transistors or field effect transistors or other devices having the same characteristics. In the present embodiment, connection manners of a drain and a source of each transistor can be exchanged with each other. Therefore, drains and sources of respective transistors in the embodiment of the present disclosure do not make any distinction. Herein, in order to distinct the two electrodes other than the gate of the transistor, one electrode is called as a drain, and another electrode is called as a source. Thin film transistors adopted in the embodiment of the present disclosure may be N-type transistors, or may be P-type transistors. In the embodiment of the present disclosure, when the N-type thin film transistor is adopted, its first electrode can be a source, and second electrode can be a drain. In the following embodiments, by taking the thin film transistor being the N-type transistor as an example, when the signal of the gate is a high level, the thin film transistor is turned on. It can be conceived that when the P-type transistor is adopted, it needs to adjust timings of drive signals correspondingly. Specific details are not described herein, but they shall be deemed as falling into the protection scope of the present disclosure. For example, when the present disclosure is described by using the N-type transistor, since a turn-on level is a high level, a signal that controls a transistor to be turned on is sometimes referred to as "a pull-up signal" in the present disclosure, and a signal that controls a transistor to be turned off is sometimes referred to as "a pull-down signal". Those skilled in the art can understand that if the N-type transistor in the present disclosure is replaced with a P-type transistor, then "pull-up signal" in the present disclosure can be replaced with "pull-down signal", and "pull-down signal" in the present disclosure is replaced with "pull-up signal". For another example, if the N-type transistor in the present disclosure is replaced with the P-type transistor, then "pull-up node" in the present disclosure is placed with "pull-down node", and "pull-down node" in the present disclosure is replaced with "pull-up node".

At present, OLED gate driving requires to be formed by three sub-circuits, i.e., a sense unit, a scan unit and a connection unit (or a gate circuit or a Hiz circuit) that outputs a composite pulse of the sense unit and the scan unit, and the structures of the circuits are very complicated, thereby causing that the area of the gate driving circuit is very large, and it is difficult to satisfy the requirement for narrow framework of a high-resolution screen.

Additionally, the applicant finds that according to the solution of progressive scanning compensation adopted in the current gate driving circuit, a progressively moved scanning line is brought into the process of display in the process of progressive scanning compensation. Furthermore, due to difference of compensation time, it is likely to cause luminance difference between different regions. In order to solve this problem, the present disclosure proposes a new technical solution of scanning compensation.

FIG. 1 shows a schematic block diagram of a structure of a shift register unit according to some embodiments of the present disclosure. As shown in FIG. 1, the shift register unit 100 can comprise a second input sub-circuit 110, a first input sub-circuit 120 and an output sub-circuit 130. Herein, the second input sub-circuit 110, the first input sub-circuit 120 and the output sub-circuit 130 are connected via a first node (also called as "a first pull-up node" in the present disclosure) Q. The first input sub-circuit 120 is also called as a display input sub-circuit 120 in the present disclosure, and the second input sub-circuit 110 is also called as a blanking input sub-circuit 110. "Blanking" in the blanking input sub-circuit 110 only represents that this circuit is concerned with a blanking period, but does not limit that this circuit only operates in the blanking period, and so are the following respective embodiments, and thus no further details are given herein. For example, the blanking input sub-circuit 110 can charge a blanking pull-up control node H which would be mentioned in the following text in a display period, and can maintain the high level of the blanking pull-up control node H in the blanking period. The blanking input sub-circuit 110 can charge the first pull-up node Q in the blanking period so that the first pull-up node Q would become a high level.

The blanking input sub-circuit 110 is configured to receive a random input signal as a blanking input signal from a blanking input terminal OE. The random input signal can enable the blanking input sub-circuit to be in an operating state, and to input the blanking output control signal (also called as "blanking pull-up signal" in the present disclosure) to the first pull-up node Q in a blanking period of one frame. Herein, the blanking input terminal can be inputted a random pulse signal produced by a control unit (for example, FPGA, a microcontroller). In some embodiments, the random input signal is a pulse signal inputted within one random clock cycle during the display period.

In some embodiments, the blanking input sub-circuit 110 can be configured to receive and store the blanking input signal, and output a blanking pull-up signal to the first pull-up node Q according to the blanking input signal during the blanking period of one frame, so that the potential of the first pull-up node Q is pulled up to an operating potential. In some embodiments, the blanking input sub-circuit 110 can be configured to receive the random input signal as a blanking input signal during the display period of one frame.

The display input sub-circuit 120 is configured to receive a display input signal from a display input terminal in the display period of one frame and input a display output control signal (also called as "display pull-up signal" in the present disclosure) to the first pull-up node Q, so that the potential of the first pull-up node Q is pulled up to the operating potential.

The output sub-circuit 130 is configured to output a composite output signal via the output terminal under the control of the first pull-up node Q. For example, the composite output signal can comprise a display output signal and a blanking output signal. The display output signal and the blanking output signal may be two waveforms independent from each other, and their pulse widths and trigger timings are different from each other.

In some embodiments, during the display period of one frame, the output sub-circuit 130 is configured to output the display output signal via the output terminal under the control of the first pull-up node Q. During the blanking period of one frame, the output sub-circuit 230 is configured to output the blanking output signal via the output terminal under the control of the first pull-up node Q.

The shift register unit according to the embodiments of the present disclosure can randomly input the blanking input signal to the blanking input sub-circuit according to the random signal, so as to enable the shift register unit to realize a randomly outputted blanking output signal.

FIGS. 2a-2e show exemplary circuit structures of the display input circuit 120 according to an embodiment of the present disclosure. As shown in FIGS. 2a-2e, the display input sub-circuit 120 can have a variety of different connection structures and control methods.

As shown in the figure, the display input sub-circuit 120 can comprise a display input transistor M5. As shown in FIG. 2a, a first electrode of the display input transistor M5 is connected to a display input terminal STU2, a second electrode thereof is connected to the first pull-up node Q, and a control electrode thereof is connected to a first clock signal line CLKA. In some embodiments, during the display of one frame, under the control of a first clock signal inputted by the first clock signal line CLKA, the display input transistor M5 would be turned on, and take the display input signal inputted by the display input terminal STU2 as a display pull-up signal to be inputted to the first pull-up node Q.

As shown in FIGS. 2b and 2d, a first electrode of the display input transistor M5 can be connected to a high level signal line VDD/VGH, and is always inputted a high-level turn-on signal, a second electrode thereof is connected to the first pull-up node Q, and a control electrode thereof is connected to the display input terminal STU2. In some embodiments, during the display period of one frame, under the control of the display input signal inputted by the display input terminal STU2, the display input transistor M5 would be turned on, and take the high-level signal inputted by the high level signal line VDD/VGH as the display pull-up signal to be inputted to the first pull-up node Q.

For another example, as shown in FIG. 2c, the first electrode of the display input transistor M5 is connected with the control electrode thereof, and is connected to the display input terminal STU2, and a second electrode thereof is connected to the first pull-up node Q. In some embodiments, during the display of one frame, under the control of the display input signal inputted by the display input terminal STU2, the display input transistor M5 would be turned on, and at the same time take the display input signal inputted by the display input signal line STU2 as the display pull-up signal to be inputted to the first pull-up node Q.

The display input sub-circuit 120 can further comprise a second display input transistor M16, which is connected between the display input transistor M5 and the first pull-up node Q. For example, as shown in FIG. 2e, a first electrode of the second display input transistor M16 is connected with a control electrode thereof, and is connected to the second electrode of the display input transistor M5, and a second electrode thereof is connected to the first pull-up node Q.

By utilizing the display input circuit as shown in FIG. 2e, when the display input transistor is turned on under the control of the display input terminal, burrs caused at the output terminal due to capacitance coupling in the circuit can be prevented when a high-level signal is inputted to the first pull-up node Q.

Figure 3A:
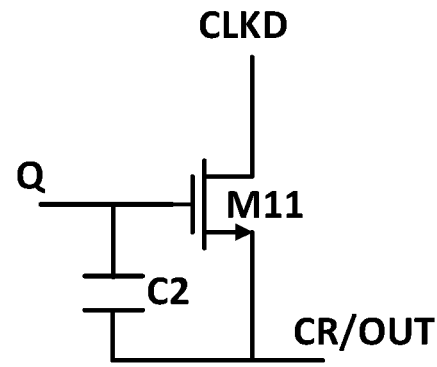
FIG. 3a shows a first exemplary circuit structure of an output sub-circuit according to some embodiments of the present disclosure.
Figure 3B:
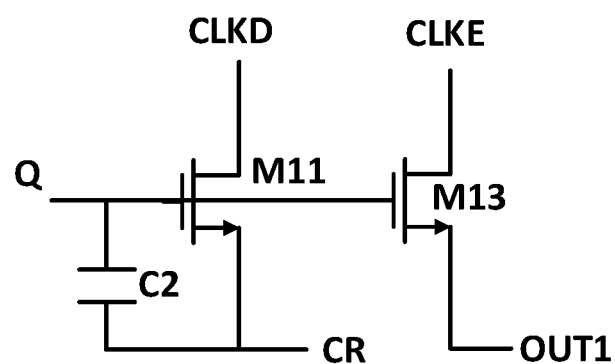
FIG. 3b shows a second exemplary circuit structure of an output sub-circuit according to some embodiments of the present disclosure.

FIGS. 3a-3b show exemplary circuit structures of the output sub-circuit 130 according to some embodiments of the present disclosure.

As shown in FIG. 3a, the output sub-circuit 130 can comprise an output transistor M11 and an output capacitor C2. A first electrode of the output transistor M11 is connected to a fourth clock signal line CLKD, a second electrode thereof is connected to the output terminal CR/OUT, and a control electrode thereof is connected to the first pull-up node Q. A first terminal of the output capacitor is connected to the first pull-up node Q, and a second terminal thereof is connected to the output terminal CR/OUT; the output capacitor C2 is used to store and maintain the potential of the first pull-up node Q. When the potential of the first pull-up node Q is maintained at a high level, the output transistor M11 is turned on under the control of the first pull-up node Q, and takes a signal inputted by the fourth clock signal line CLKD as an output signal to be outputted from the output terminal CR/OUT. The signal outputted from the CR/OUT can be simultaneously taken as a driving signal of the pixel circuit and can also be taken as a shift driving signal of the gate driving circuit.

In some embodiments, in order to increase the driving capability of the shift register unit, the output sub-circuit 130 can further comprise two output terminals. For example, as shown in FIG. 3b, the output sub-circuit 130 can comprise a first output transistor M11 and a second output transistor M13. A first electrode of the first output transistor M11 is connected to the fourth clock signal line CLKD, a second electrode thereof is connected to a first output terminal CR, and a control electrode thereof is connected to the first pull-up node Q. A first electrode of the second output transistor M13 is connected to a fifth clock signal line CLKE, a second electrode thereof is connected to a second output terminal OUT1, and a control electrode thereof is connected to the first pull-up node Q. Herein, the signal outputted by the first output terminal CR can be used as a shift driving signal of the gate driving circuit, and the signal outputted by the second output terminal OUT1 can be used as a driving signal of the pixel circuit. Herein, the fourth clock signal line CLKD and the fifth clock signal line CLKE may be different clock signal lines or may be a same clock signal line.

In some other embodiments, the output sub-circuit 230 can further comprise more output terminals. For example, although it is not shown in the figures, the output sub-circuit 230 can further comprise a third output transistor having a first electrode connected to a clock signal line, a second electrode connected to a third output terminal, and a control electrode connected to the first pull-up node Q. The clock signal line connected to the third output transistor may be a clock signal line the same as the fourth clock signal line CLKD and the fifth clock signal line CLKE, or may be a clock signal line different from the fourth clock signal line CLKD and the fifth clock signal line CLKE.

By utilizing the output sub-circuits having multiple output terminals, a plurality of different driving signals can be provided to the pixel circuit, thereby increasing flexibility of the driving mode of the pixel circuit. For example, for a common 3T1C-type pixel circuit, two driving signals can be provided respectively for scanning and sensing driving signals of the transistor.

Although the above description only shows the examples in which the shift register unit comprises one, two, and three output terminals, those skilled in the art can understand that according to the principles of the present disclosure, more output terminals can be set according to the actual situation. The above examples shall not form a limitation to the protection scope of the present disclosure.

Figure 4:
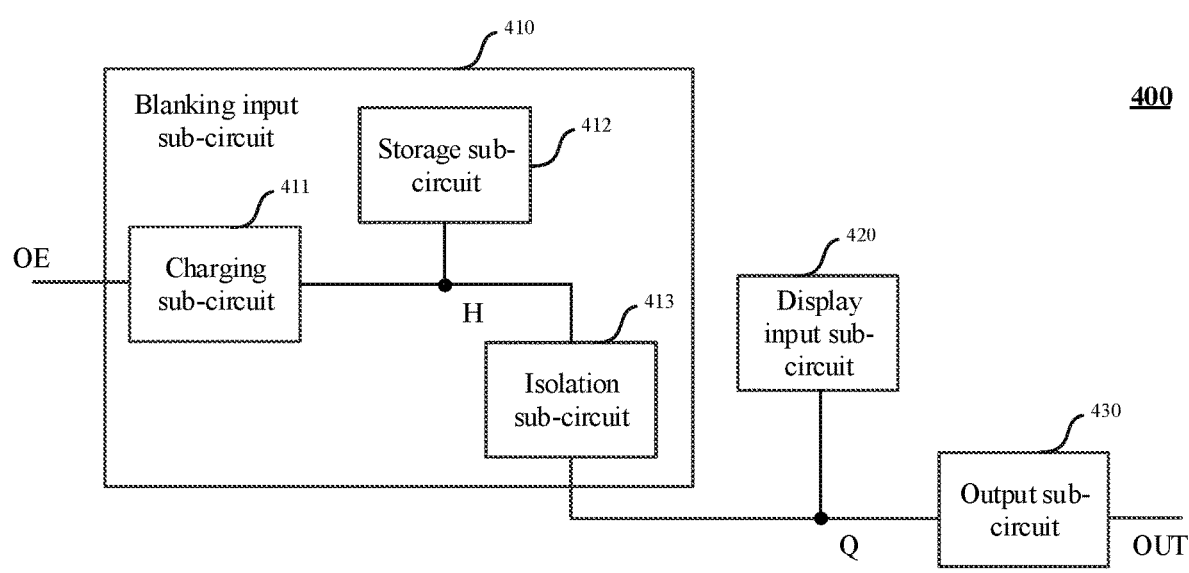
FIG. 4 shows a schematic block diagram of an exemplary structure of a shift register unit according to some embodiment of the present disclosure.

FIG. 4 shows a schematic block diagram of an exemplary structure of a shift register unit according to some embodiments of the present disclosure. As shown in FIG. 4, the shift register unit 400 comprises a blanking input sub-circuit 410, a display input sub-circuit 420 and an output sub-circuit 430. The display input sub-circuit 420 and the output sub-circuit 430 can be the display input sub-circuit 120 shown in FIGS. 2a and 2e, the output sub-circuit 130 shown in FIGS. 3a and 3b and modifications thereof, and thus no further details are given herein.

As shown in FIG. 4, the blanking input sub-circuit 410 can comprise a charging sub-circuit 411, a storage sub-circuit 412 and an isolation sub-circuit 413.

The charging sub-circuit 411 is configured to charge a blanking control node (also called as "blanking pull-up control node" in the following text) H according to the random input signal. In some embodiments, the charging sub-circuit 411 can receive the random input signal and input a high level blanking input signal to the blanking pull-up control node H under the control of the random input signal.

One terminal of the storage sub-circuit 412 is connected to the blanking pull-up control node H, and the storage sub-circuit 412 is configured to store the blanking control signal (also called as "blanking pull-up control signal" in the present disclosure).

The isolation sub-circuit 413 is configured to input the blanking pull-up signal to the first pull-up node Q according to the blanking pull-up control signal in the blanking period of one frame. In some embodiments, the isolation sub-circuit 413 is disposed between the first pull-up node Q and the blanking pull-up control node H and configured to prevent the first pull-up node Q and the blanking pull-up control node H from influencing each other. For example, when it is not necessary to output the blanking pull-up signal, the isolation sub-circuit 313 can disconnect the first pull-up node Q from the blanking pull-up control node H.

The shift register unit according to the embodiments of the present disclosure can realize control of the first pull-up node Q by the blanking input sub-circuit and the display input sub-circuit respectively in different periods of time, so as to realize that the blanking input sub-circuit and the display input sub-circuit share a same output unit to achieve the output of the composite output signal.

FIGS. 5a-5c show an exemplary circuit structure of a blanking input sub-circuit according to an embodiment of the present disclosure. As shown in FIGS. 5a-5c, the blanking input sub-circuit 410 can comprise a charging sub-circuit 411, a storage sub-circuit 412 and an isolation sub-circuit 413.

As showing in FIG. 5a, the charging sub-circuit 411 can comprise a charging transistor M1 and is configured to charge the blanking pull-up control node H according to the random input signal OE. For example, a control electrode of the charging transistor M1 can be connected to a random signal input terminal, a first electrode thereof can be connected to the output terminal CR/OUT of the shift register unit, and a second electrode thereof is connected to the blanking pull-up control node. In some embodiments, the control electrode of the charging transistor M1 can also be connected to the random signal input terminal, and the first electrode thereof is connected to an output terminal CR<N−1> of a previous stage of shift register. As shown in FIG. 5c, in some embodiments, the control electrode of the charging transistor M1 can also be connected to the output terminal CR<N−1> of a previous stage of shift register or an output terminal CR<N> of the present stage of shift register unit, and the first electrode thereof is connected to the random signal input terminal.

In some embodiments, the charging sub-circuit 411 can be configured to input the blanking input signal to the blanking pull-up control node H according to the random input signal. For example, the random input terminal is randomly inputted a high-level signal during the display period of the shift register unit, and the charging transistor M1 is turned on under the control of the random input signal. For a shift register unit which outputs a high-level signal from its output terminal at this time, the high-level signal can be inputted to the blanking pull-up control node H via a turned-on charging transistor M1, i.e., charge the blanking pull-up control node H. For a shift register unit which does not output a high-level signal from the output terminal at this time, although the charging transistor M1 is turned on under the control of the random input signal, since no high-level output signal exists, the blanking pull-up control node H cannot be charged. By using the above circuit structure, a shift register unit can be selected randomly among a plurality of shift register unit connected in cascades to be compensated according to the random pulse signal.

The storage sub-circuit 412 can comprise a first capacitor C1 configured to store the blanking pull-up control signal. One terminal of the first capacitor C1 is connected to the blanking pull-up control node H. As shown in FIGS. 5a, 5b, and 5c, a first terminal of the first capacitor C1 is connected to the blanking pull-up control node H, and a second terminal thereof is connected to a first signal terminal VGL/VGL1. The VGL/VGL1 can be inputted a low-level signal. As described above, when the blanking pull-up control node H is charged by the charging sub-circuit 411, the first capacitor can be charged and the potential of the blanking pull-up control node H can be maintained at the high level.

The first capacitor C1 can have other connection modes. For example, the first terminal of the first capacitor C1 can be connected to the blanking pull-up control node H, and a second terminal thereof is connected to one terminal (e.g., a second clock signal line CLKB) of the isolation sub-circuit 413. For another example, the first terminal of the first capacitor C1 can be connected to the blanking pull-up control node H, and a second terminal thereof is connected to a point (e.g., a connection point N of the first isolation transistor M3 and the second isolation transistor M4) in the isolation sub-circuit 413.

The isolation sub-circuit 413 can comprise a first isolation transistor M3 and a second isolation transistor M4. In some embodiments, the isolation sub-circuit 413 is configured to output the blanking pull-up signal to the first pull-up node Q under the control of the blanking pull-up control node.

For example, a first electrode of the first isolation transistor M3 is connected to the second clock signal line CLKB, a second electrode thereof is connected to a first electrode of the second isolation transistor M4, and a control electrode thereof is connected to the blanking pull-up control node H. A second electrode of the second isolation transistor M4 is connected to the first pull-up node Q, and a control electrode thereof is connected to the second clock signal line CLKB. When the blanking pull-up control node H is maintained at a high level under the control of the storage sub-circuit, the first isolation transistor M3 is turned on under the control of the blanking pull-up control node H. When the second clock signal line CLKB is input a high-level turn-on signal, the second isolation transistor M4 is turned on under the control of the turn-on signal, and takes the high-level signal inputted by the second clock signal line CLKB as the blanking pull-up signal to be inputted to the first pull-up node Q.

In some embodiments, as shown in FIG. 5b, the isolation sub-circuit 413 can further comprise a third isolation transistor M2. The third isolation transistor M2 can be connected with the first isolation transistor M3 and the second isolation transistor M3 in series. Furthermore, a control electrode of the third isolation transistor M2 can be connected to a first clock signal line CLKA. The first clock signal is used to prevent the first pull-up node of the a next row of shift register unit from being written a high potential by mistake because the second clock signal CLKB is at a high potential, thereby resulting in an abnormal output. Although FIG. 5a shows an exemplary structure of the third isolation transistor M2 being connected between the second isolation transistor M4 and the first pull-up node Q, those skilled in the art can understand that positions of the second isolation transistor M4 and the third isolation transistor M2 in FIG. 5b can also be exchanged with each other.

Although it is not shown in the figure, the isolation sub-circuit 413 can also be realized as other connection manners. The first electrode of the first isolation transistor M3 can be connected to a high-level signal line. When the blanking pull-up control node H is maintained at a high level under the control of the storage sub-circuit, the first isolation transistor M3 is turned on under the control of the blanking pull-up control node H. When the second clock signal line CLKB is inputted a high-level turn-on signal, the second isolation transistor M4 is turned on under the control of the turn-on signal, and takes the high-level signal inputted by the high-level signal line as the blanking pull-up signal to be inputted to the first pull-up node Q.

As described above, the charging sub-circuit 411, the storage sub-circuit 412 and the isolation sub-circuit 413 can have a variety of different connection manners respectively. Those skilled in the art can understand that, according to the principle of the present disclosure, various modifications of the charging sub-circuit 411, the storage sub-circuit 412 and the isolation sub-circuit 413 as described above can be combined in a arbitrary way.

Figure 6:
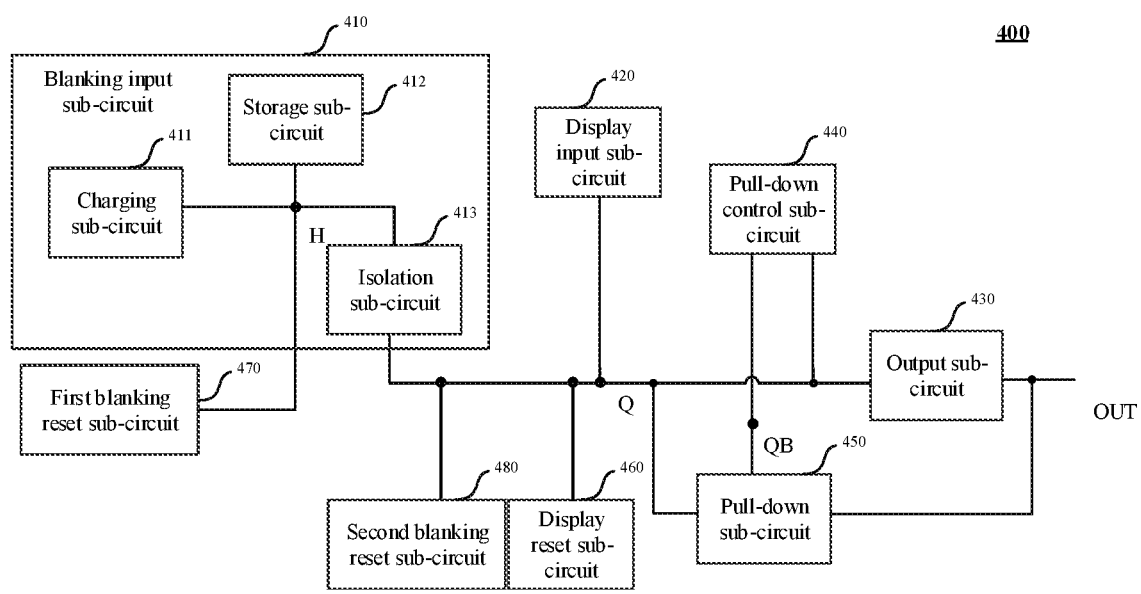
FIG. 6 shows a schematic diagram of another structure of a shift register unit according to some embodiments of the present disclosure.

FIG. 6 shows a schematic block diagram of another structure of a shift register unit according to an embodiment of the present disclosure. As shown in FIG. 6, the shift register unit 400 can comprise a blanking input sub-circuit 410, a display input sub-circuit 420, an output sub-circuit 430, a pull-down control sub-circuit 440, a pull-down sub-circuit 450, a display reset sub-circuit 460, a first blanking reset sub-circuit 470 and a second blanking reset sub-circuit 480, of which the blanking input sub-circuit 410, the display input sub-circuit 420 and the output sub-circuit 430 can be the blanking input sub-circuit 110/420, the display input sub-circuit 120/420 and the output sub-circuit 130/430 as shown in FIGS. 1-5c, and thus no further details are given herein.

As shown in FIG. 6, the shift register unit 400 can further comprise a pull-down control sub-circuit 440 configured to control the potential of the pull-down node QB according to the first pull-up node Q. For example, when the potential of the first pull-up node Q is at a high level, the pull-down control sub-circuit 410 can pull down the pull-down node QB to the low level under the control of the first pull-up node Q. For another example, when the potential of the first pull-up node Q is at a low level, the pull-down control sub-circuit 410 can pull up the pull-down node QB to the high level under the control of the first pull-up node Q.

The shift register unit 400 can further comprise a pull-down sub-circuit 450, which is configured to pull down the first pull-up node Q and the output terminal OUT to a non-operating potential under the control of the pull-down node QB. For example, when the output terminal OUT does not output any signal, the first pull-up node Q and the output terminal OUT can be pulled down to the non-operating potential by controlling the potential of the pull-down node QB, so as to reduce noise at the output terminal in the circuit of the shift register unit.

In some embodiments, the shift register unit 400 can further comprise a display reset sub-circuit 460, which is configured to reset the first pull-up node Q under the control of the display reset control signal. In some embodiments, after the shift register unit 400 outputs a display output signal during the display period of one frame, and before the display period ends up, the reset control signal can be received by the display reset sub-circuit 460, so that the potential of the first pull-up node Q is pulled down to the low level.

In some embodiments, the shift register unit 400 can further comprise a first blanking reset sub-circuit 470, which is configured to reset the blanking pull-up control node H before the end of the blanking period of one frame and after the output of the blanking output signal of a current frame.

In some embodiments, the shift register unit 400 can further comprise a second blanking reset sub-circuit 480, which is configured to reset the first pull-up node Q and/or the output terminal OUT before the end of the blanking period of one frame and after the output of the blanking output signal of a present frame. In some embodiments, after the shift register unit 400 outputs the blanking output signal during the blanking period of one frame, and before the blanking period ends up, the blanking reset control signal can be received by the blanking reset sub-circuit 470, so that the potential of the first pull-up node Q is pulled down to a low level. In some other embodiments, the potential of the output terminal OUT can also be pulled down to the low level by the blanking reset sub-circuit 470 t, so as to reduce noise at the output terminal in the circuit of the shift register unit.

In some embodiments, the shift register unit 400 can further comprise an initial reset sub-circuit (not shown), which is configured to receive an initial reset control signal and reset the blanking pull-up control node H before the shift register unit 400 starts operating.

Those skilled in the art can understand that, although the shift register unit in FIG. 6 shows the pull-down control sub-circuit 440, the pull-down sub-circuit 450, the display reset sub-circuit 460, the first blanking reset sub-circuit 470 and the second blanking reset sub-circuit 480, the above examples cannot limit the protection scope of the present disclosure. In the actual application, technicians can select to use or not use one or more of the above respective circuits according to the situation. Various combinations and modifications made based on respective sub-circuits do not depart from the principle of the present disclosure, and thus no further details are given herein.

The shift register unit provided according to the present disclosure can realize controlling the first pull-up node Q by the blanking input sub-circuit and the display input sub-circuit respectively in different periods of time, so as to realize that the blanking input sub-circuit and the display input sub-circuit share the same output unit and achieve the output of the composite output signal. Furthermore, by inputting the random input signal to the blanking input sub-circuit, the shift register unit to output the blanking output signal for compensation can be selected randomly.

Figure 7:
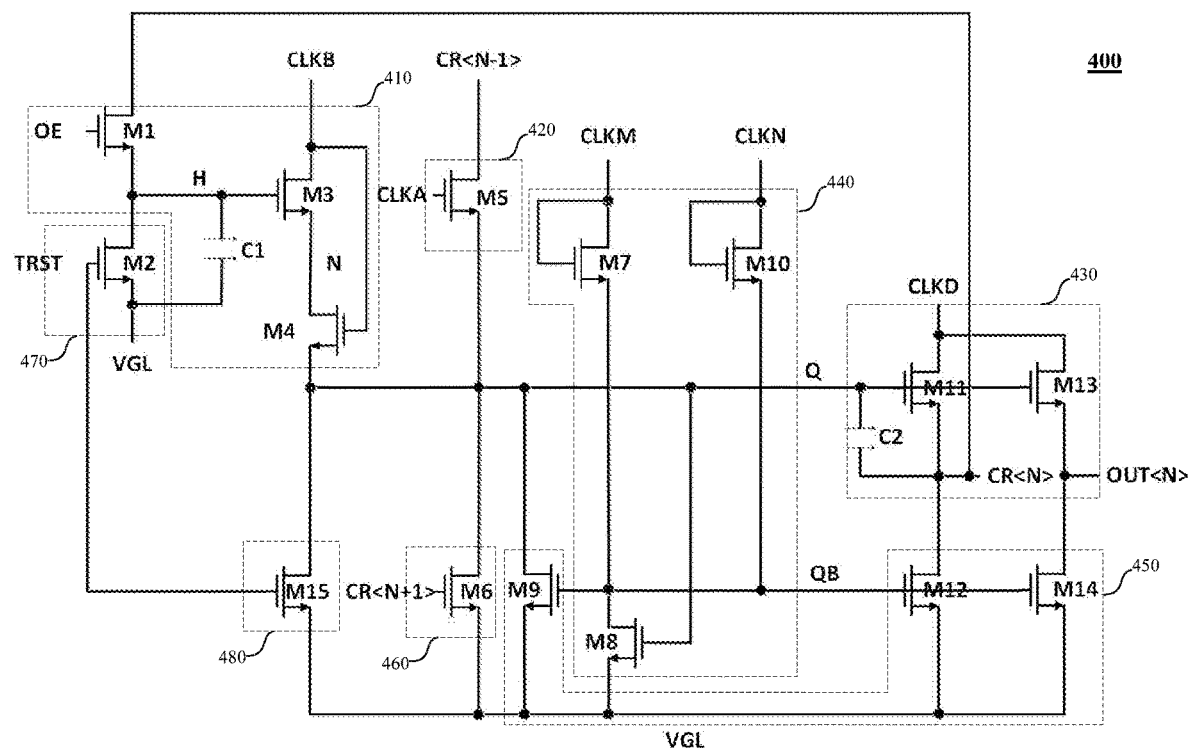
FIG. 7 shows an exemplary circuit structure of a shift register unit according to some embodiments of the present disclosure.

FIG. 7 shows an exemplary circuit structure of a shift register unit according to some embodiments of the present disclosure. The blanking input sub-circuit 410, the display input sub-circuit 420 and the output sub-circuit 430 as shown in FIG. 7 are the same as the blanking input sub-circuit, the display input sub-circuit and the output sub-circuit as shown in FIGS. 1-5c, and thus no further details are given herein.

As shown in FIG. 7, the pull-down control sub-circuit 440 can comprise a first pull-down control transistor M7, having a control electrode connected with a first electrode, and connected to a seventh clock signal line CLKM, and a second electrode connected to the pull-down node QB. During the operation of the shift register unit 400, the seventh clock signal line CLKM can be always inputted a high-level turn-on signal. The pull-down control sub-circuit 440 can further comprise a second pull-down control transistor M8, having a first electrode connected to the pull-down node QB, a second electrode connected to a fourth signal terminal VSS4, and a control electrode connected to the first pull-up node Q. Herein, the fourth signal terminal VSS4 can be inputted a low-level non-turned-on signal. When the first pull-up node Q is at a high level, the second pull-down control transistor M8 would be turned on under the control of the first pull-up node Q, and the potential of the pull-down node QD can be pulled down to a low level by designing a channel width-to-length ratio of the first pull-down control transistor M7 and the second pull-down control transistor M8. When the first pull-up node Q is at a low level, the second pull-down control transistor M8 would be turned off under the control of the first pull-up node Q. At this time, the high-level signal inputted by the seventh clock signal line CLKM would be inputted to the pull-down node QB and pull up the potential of the pull-down node QB to the high level.

In the above embodiment, the seventh clock signal line CLKM is always inputted a high-level signal during the operation of the shift register unit. Therefore, the first pull-down control transistor M7 is always in a turn-on state. In order to avoid performance drift caused by long-term turn-on of the transistors, the pull-down control sub-circuit 440 can further comprise a third pull-down control transistor M10, having a control electrode connected with its first electrode and is connected to an eighth clock signal line CLKN, and a second electrode connected to the pull-down node QB. It can be seen that the third pull-down control transistor M10 and the first pull-down control transistor M7 have the same structure. In the process of using, functions of the pull-down control sub-circuit 440 can be realized by using the third pull-down control transistor M10 and the first pull-down control transistor M7 alternatively. For example, when the seventh clock signal line CLKM is input a high-level signal, the eighth clock signal line CLKN is inputted a low-level signal. Therefore, at this time, the first pull-down control transistor M7 is turned on, and the third pull-down control transistor M10 is turned off. When the seventh clock signal line CLKM is inputted a low-level signal, the eighth clock signal line CLKN is inputted a high-level signal. Therefore, at this time, the first pull-down control transistor M7 is turned off, and the third pull-down control transistor M10 is turned on.

As shown in FIG. 7, the pull-down sub-circuit 450 can comprise a first pull-down transistor M9, having a first electrode connected to the first pull-up node Q, a second electrode connected to the third signal line VSS3, and a control electrode connected to the pull-down node QB. The third signal line VSS3 can be inputted a low-level non-turned-on signal. When the pull-down node QB is at a high level, the first pull-down transistor M9 would be turned on under the control of the pull-down node QB, and pull down the first pull-up node Q to the low level.

The pull-down sub-circuit 450 can further comprise a second pull-down transistor M12. A first electrode of the second pull-down transistor M12 is connected to the first output terminal CR, a second electrode thereof is connected to the second signal line VGL, and a control electrode thereof is connected to the pull-down node QB. The second signal line VGL can be inputted a low level non-turned-on signal. When the pull-down node QB is at a high level, the second pull-down transistor M12 would be turned on under the control of the pull-down node QB, and pull down the first output terminal CR to the low level.

When the output sub-circuit comprises a plurality of output terminals, the pull-down sub-circuit can further comprise more pull-down transistors correspondingly. For example, as shown in FIG. 7, the pull-down sub-circuit 450 can further comprise a third pull-down transistor M14, having a first electrode connected to a second output terminal OUT, a second electrode connected to a second signal line VGL, and a control electrode connected to the pull-down node QB. Herein, the second signal line VGL can be inputted a low-level non-turned-on signal. When the pull-down node QB is at a high level, the third pull-down transistor M14 would be turned on under the control of the pull-down node QB, and pull down the second output terminal OUT to the low level.

As shown in FIG. 7, the display reset sub-circuit 460 can comprise a display reset transistor M6, having a first electrode connected to the first pull-up node Q, a second electrode connected to the second signal line VGL, and a control electrode connected to the display reset control terminal. In the gate driving circuit formed by shift register units connected in cascades, as for the N-th stage of shift register unit, its display reset control terminal can be an output terminal of the (N+1)-th stage of shift register unit. The second signal line VGL can be inputted a low-level non-turned-on signal. In the display period of one frame, when the display reset control terminal is inputted a high-level turn-on signal, the display reset transistor M6 would be turned on, and pull down the first pull-up node Q to the low level.

As shown in FIG. 7, the first blanking reset sub-circuit 470 can comprise a first blanking reset transistor M2, having a first terminal connected to the blanking pull-up control node H, a second electrode connected to the second signal line VGL, and a control electrode connected to the blanking reset control terminal TRST. The second signal line VGL can be inputted a low-level non-turned-on signal. When the blanking reset control terminal TRST is inputted a high-level turn-on signal, the first blanking reset transistor M2 would be turned on, and reset the blanking pull-up control node H.

As shown in FIG. 7, the second blanking reset sub-circuit 480 can comprise a second blanking reset transistor M15, having a first electrode connected to the first pull-up node Q, a second electrode connected to the second signal line VGL, and a control electrode connected to the blanking reset control terminal TRST. The second signal line VGL can be inputted a low-level non-turned-on signal. Before the blanking period of one frame ends up, and the blanking reset control terminal TRST can be inputted a high-level turned-on signal. At this time, the second blanking reset transistor M15 would be turned on, and pull down the first pull-up node Q to the low level.

It needs to be specified that in the example shown in FIG. 7, the control terminals of the first blanking reset transistor M2 and the second blanking reset transistor M15 are connected to a same reset signal TRST, so that reuse of signals is realized, and the number of signal lines in the circuit structure is reduced. However, those skilled in the art can understand that the control terminals of the first blanking reset transistor M2 and the second blanking reset transistor M15 may also be connected to different reset signal lines. As long as the functions as described above can be satisfied, those skilled in the art can set the number of the signal lines according to the actual situation.

Additionally, the second signal line VGL for inputting a reset signal shown in FIG. 7 may be set as a same signal line, or may be set as a different signal line. As long as it is capable of realizing the functions of the shift register unit and the controlling modes of respective transistors therein as described above, those skilled in the art can set the above signal lines arbitrarily according to the actual situation.

Figure 8:
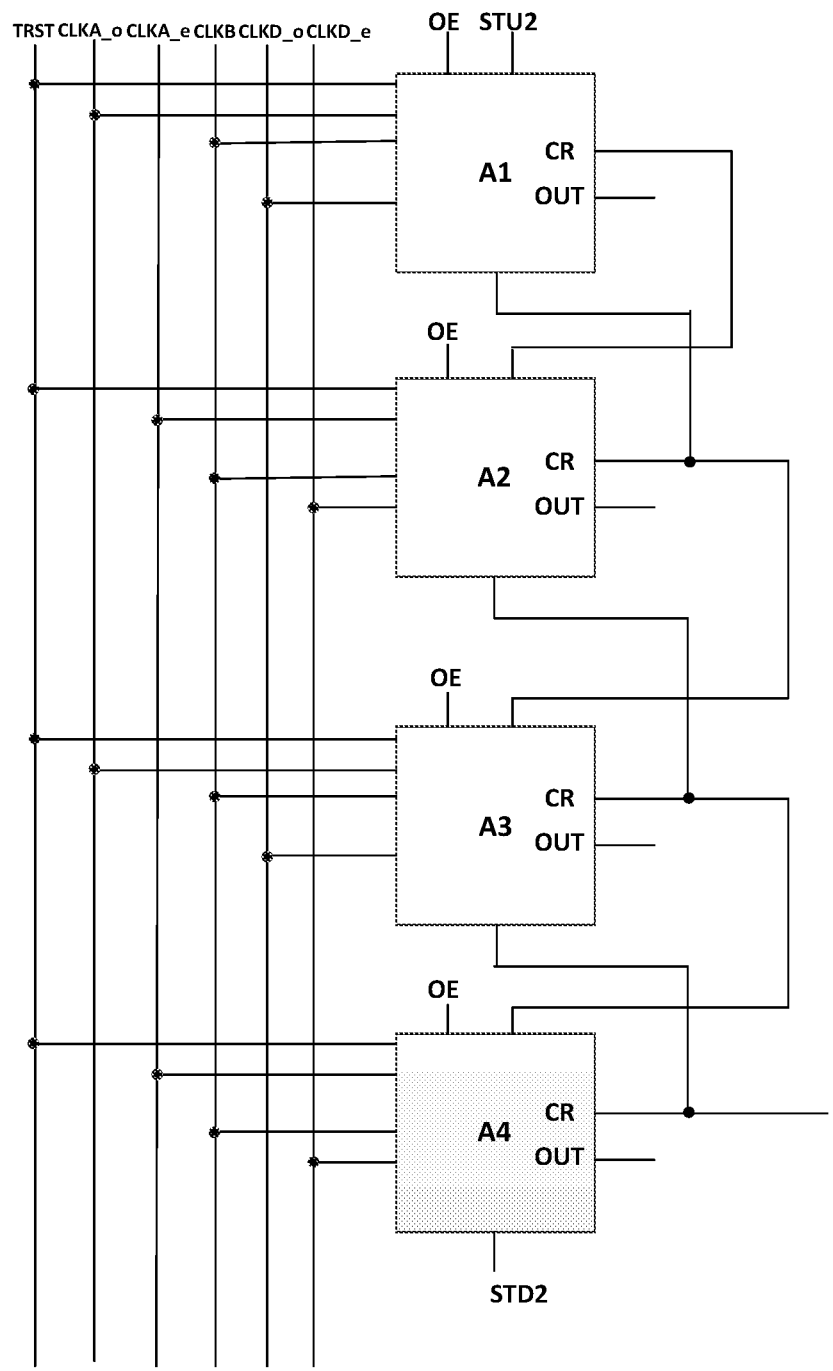
FIG. 8 shows a schematic block diagram of a gate driving circuit according to some embodiments of the present disclosure.

FIG. 8 shows a schematic block diagram of a gate driving circuit according to an embodiment of the present disclosure. As shown in FIG. 8, the gate driving circuit comprises multiple stages of shift register units connected in cascades, of which any state or multiple stages of shift register units can adopt the structures of the shift register units as shown in one of FIGS. 1-7 or modifications thereof.

According to the cascade structure of the shift register unit of the gate driving circuit as shown in FIG. 8, a display input terminal STU of a i-th stage of shift register unit is connected to an output terminal CR of an (i−1)-th stage of shift register unit, and an output terminal CR of the i-th stage of shift register unit is connected to a display reset terminal STD2 of the (i−1)-th stage of shift register unit, where N is an integer greater than 2, 1<i≤N. A display input terminal STU of a first stage of shift register unit is connected to the display signal line; a display reset control terminal STD2 of an N-th stage of shift register unit is connected to the display reset signal line. Blanking input terminals of all shift register units in the gate driving circuit as shown in FIG. 8 are connected to the random input signal OE.

Each row of shift register unit is connected to the second clock signal line CLKB respectively. Each row of shift register unit can be connected to the initial reset signal line TRST. An odd-numbered row of shift register unit is connected to a first clock signal line CLKA_o, and a fourth clock signal line CLKD_o respectively, and an eventh-numbered row of shift register unit is connected to a first clock signal line CLKA_e, and a fourth clock signal line CLKD_e. Although FIG. 8 only shows the reset signal line TRST and the clock signal line CLKB, the CLKA and CLKD, those skilled in the art can understand that according to the actual requirement, the shift register unit can be connected to other required signal lines.

Figure 9:
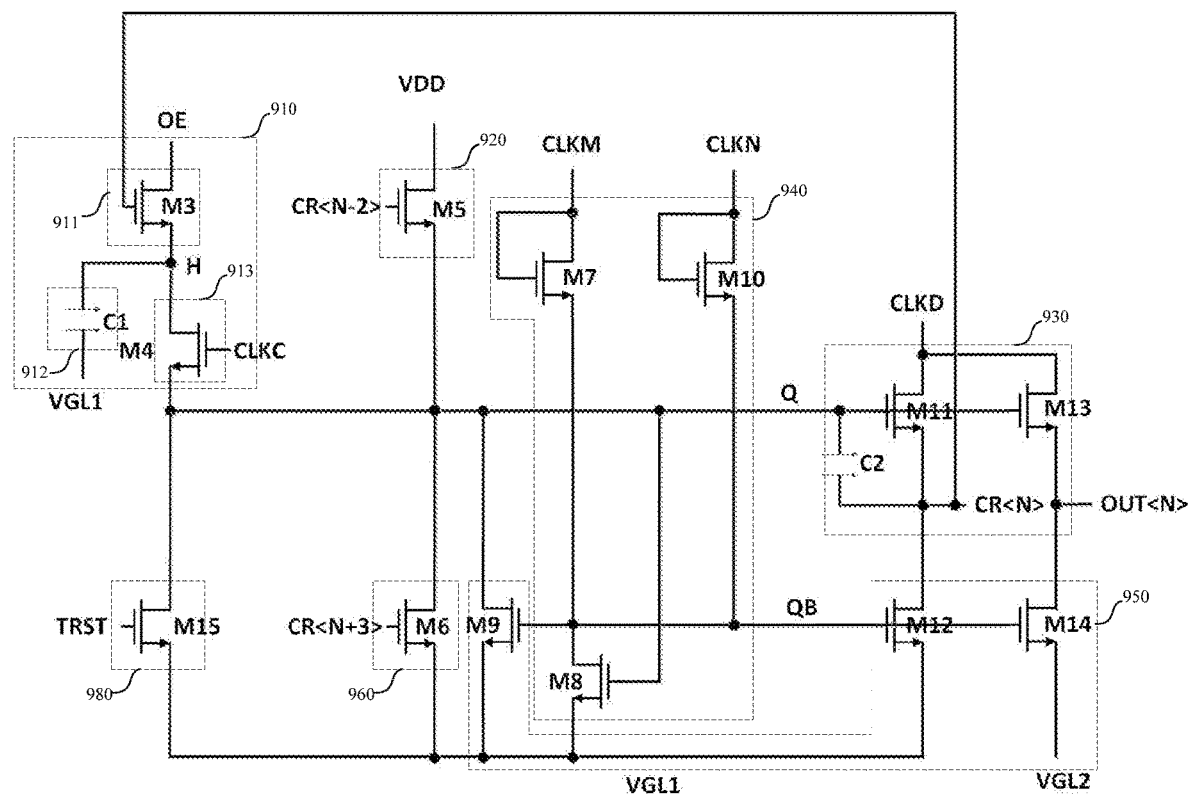
FIG. 9 shows another exemplary circuit structure of a shift register unit according to some embodiments of the present disclosure.

FIG. 9 shows another exemplary circuit structure of a shift register unit according to some embodiments of the present disclosure. The display input sub-circuit 420, the output sub-circuit 430, the pull-down control sub-circuit 440, the pull-down sub-circuit 450, the display reset sub-circuit 460 and the second blanking reset sub-circuit 480 as shown in FIG. 9 are the same as the display input sub-circuit, the output sub-circuit, the pull-down control sub-circuit, the pull-down sub-circuit, the display reset sub-circuit and the second blanking reset sub-circuit as shown in FIG. 7, and thus no further details are given herein.

As shown in FIG. 9, the blanking input sub-circuit 412 can comprise a charging sub-circuit 411, a storage sub-circuit 412 and an isolation sub-circuit 413. In some embodiments, the charging sub-circuit 411 can comprise a charging transistor M3, having a control electrode connected to the output terminal of the present stage of shift register unit, a first electrode connected to the random signal input terminal OE, and a second electrode connected to the blanking pull-up control node H. The charging transistor M3 is configured to be turned on when the shift register unit outputs a display output signal, and if the random signal input terminal OE is inputted a random high-level signal at this time, then the blanking pull-up control node H is charged via the charging transistor M3. In addition, when the potential of the blanking pull-up control node H is a high level, and when the output terminal of the shift register unit outputs a signal, if the random signal input terminal is not randomly inputted a high-level signal, but inputted a low-level signal, then when the charging transistor M3 is turned on under the control of the output signal of the output terminal, the blanking control pull-up node H can be discharged via the random input terminal.

It can be understood that, when the random input terminal is inputted a random pulse signal, for a shift register unit without any signal outputted, the gate of its charging transistor is inputted a low-level non-turned-on signal, that is, the charging transistor M3 is turned off. At this time, even if the first electrode of the charging transistor M3 receives the high-level signal from the random signal input terminal, the blanking pull-up control node H cannot be charged.

The storage sub-circuit 412 can comprise a first capacitor C1, configured to store the blanking pull-up control signal. One terminal of the first capacitor C1 is connected to the blanking pull-up control node H. As shown in FIG. 9, a first terminal of the first capacitor C1 is connected to the blanking pull-up control node H, and a second terminal thereof is connected to the first signal terminal VGL. The VGL can be inputted a low-level signal. As described above, when the blanking pull-up control node H is charged via the charging sub-circuit 411, the first capacitor can be charged and the potential of the blanking pull-up control node H is maintained at a high level.

The isolation sub-circuit 413 can comprise an isolation transistor M4, having a control electrode connected to the third clock signal terminal CLKC, a first electrode connected to the blanking pull-up control node H, and a second electrode connected to the first pull-up node Q. The isolation transistor M4 is configured to input the blanking pull-up control signal to the first pull-up node Q via the isolation transistor M4 and pull up the level at the first node Q to the high level, when the third clock signal terminal is inputted a high-level signal.

The shift region unit as shown in FIG. 9 and the shift register unit as shown in FIG. 7 have the following distinction: in the shift register unit 900 as shown in FIG. 9, the display input terminal connected to the display input sub-circuit 920 is connected to an output terminal of the (N−2)-th stage of shift register unit. The display reset control terminal connected to the display reset sub-circuit 960 is connected to an output terminal of an (N+3)-th stage of shift register unit. Although it is not shown in the figure, the display reset control terminal connected to the display reset sub-circuit 960 can also be connected to the output terminal of the (N+2)-th stage of shift register unit.

Figure 10:
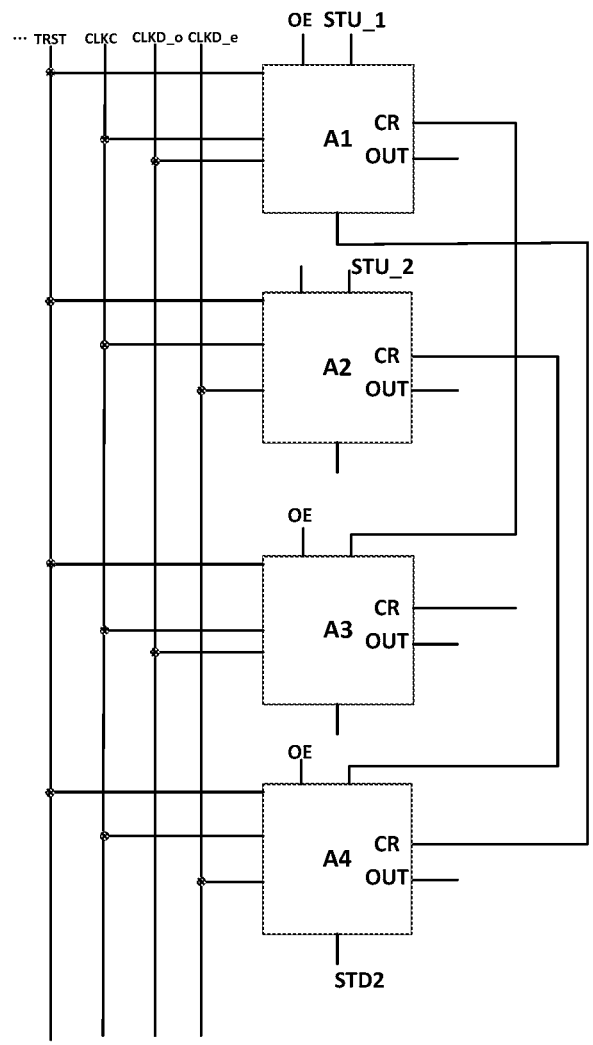
FIG. 10 shows a schematic block diagram of a gate driving circuit according to some embodiments of the present disclosure.

FIG. 10 shows a schematic block diagram of a gate driving circuit according to some embodiments of the present disclosure. As shown in FIG. 10, only previous 4 stages of the N stages of shift register units connected in cascades are shown in the figure. The figure only shows the previous 4 stages of the N stages of shift register units connected in cascades, where N is a positive integer. As for 2<i<N−2, a display input terminal of an i-th row of shift register unit is connected to an output terminal of an (i−2)-th row of shift register unit, and a display reset terminal of the i-th row of shift register unit is connected to an output terminal of an (i+3)-th row of shift register unit. At the same time, a display input terminal of a first row of shift register unit is connected to the first display input signal line, and a display input terminal of a second row of shift register unit is connected to a second display input signal line, and a display reset terminal of an (N−2)-th row of shift register unit is connected to the first display reset signal line, and a display reset terminal of an (N−1)-th shift register unit is connected to the second display reset signal line. A display reset terminal of an N-th row of shift register unit is connected to a third display reset signal line. Herein, blanking input terminals of all the shift register units are connected to the random signal input terminal.

Each row of shift register unit is connected to the second clock signal line CLKB and the third clock signal line respectively. Each row of shift register unit can be connected to the blanking reset signal line TRST. An odd-numbered row of shift register unit is corrected to the first clock signal CLKA_o and the fourth clock signal CLKD_o respectively, and an eventh-numbered row of shift register unit is connected to the first clock signal line CLKA_e and the fourth clock signal line CLKD_e respectively. A clock signal inputted by a fourth clock signal line connected to a second row of shift register unit has a clock width as the same as the clock signal inputted by the fourth clock signal line connected to the first row of shift register unit, but the rising edge of the clock signal inputted by the fourth clock signal line connected to the second row of shift register unit is later by a half clock signal width than the rising edge of the clock signal inputted by the fourth clock signal line connected to the first row of shift register unit, and correspondingly, the display input signal outputted by the second row of shift register unit is also later by a half clock signal width than the display input signal outputted by the first row of shift register unit. At this time, 50% pulse overlap exists between the display output signal of the first row of shift register unit and the display output signal of the second row of shift register unit. Those skilled in the art can understand that by utilizing the principles provided in the present disclosure, display output signals having other overlap proportions can be realized.

Figure 11:
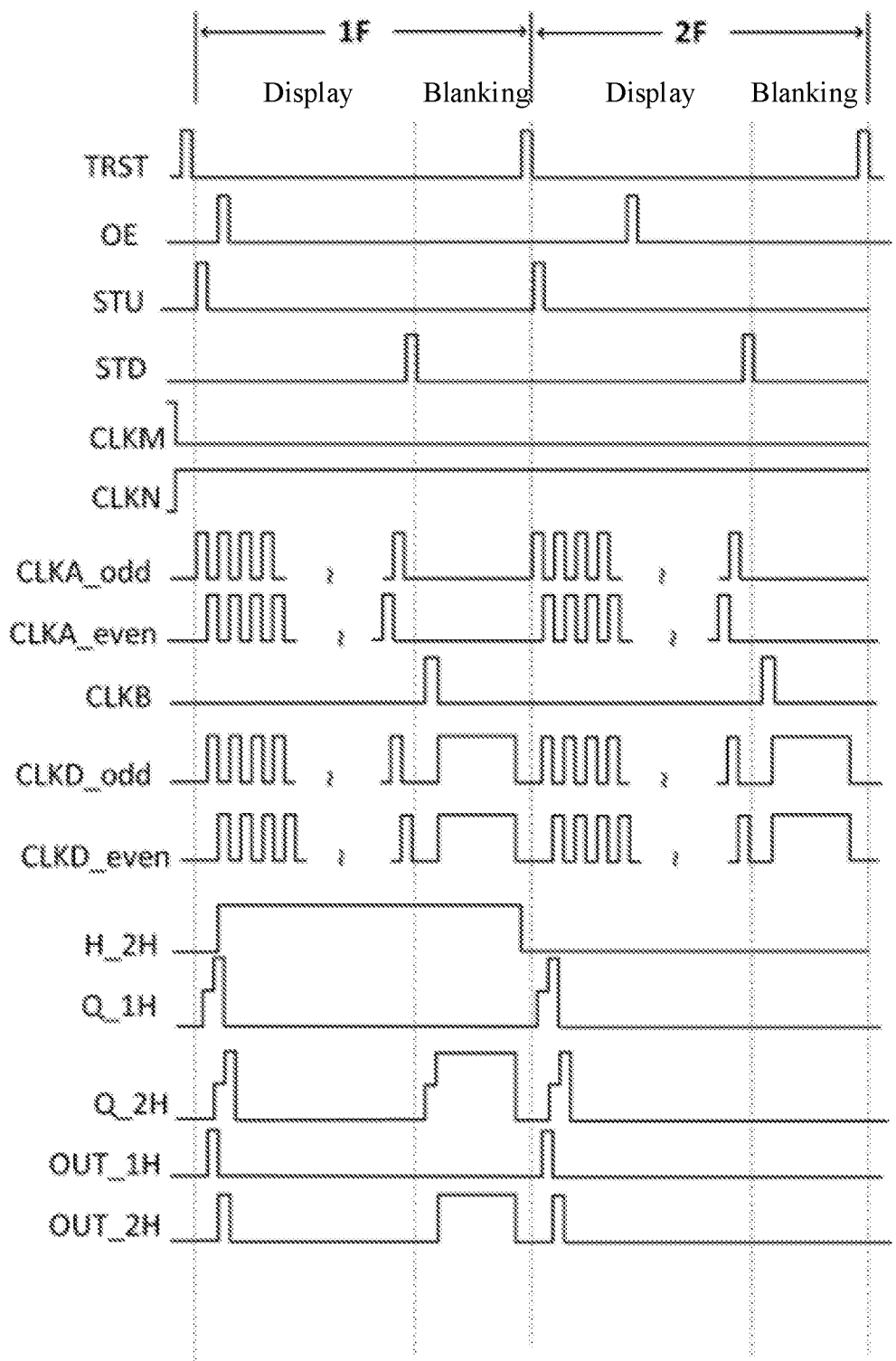
FIG. 11 shows a driving timing diagram of a gate driving circuit according to some embodiments of the present disclosure.

FIG. 11 shows a driving timing diagram of a gate driving circuit according to some embodiments of the present disclosure. The driving timing as shown in FIG. 11 is described by taking the shift register unit as shown in FIG. 7 and the gate driving circuit as shown in FIG. 8 as an example.

Herein, in the driving timing as shown in FIG. 11, CLKA_odd represents the first clock signal line CLKA of the odd-numbered row (for example, the first, third, fifth row . . . ) of shift register unit in the gate driving circuit, CLKA_even represents the first clock signal line CLKA of the even-numbered row (for example, the second, fourth, sixth row . . . ) of shift register unit in the gate driving circuit. Similarly, CLKD_odd represents the fourth clock signal line CLKD of the odd-numbered row (for example, the first, third, fifth row . . . ) of shift register unit in the gate driving circuit, CLKD_even represents the fourth clock signal line CLKD of the even-numbered row (for example, the second, fourth, sixth row . . . ) of shift register unit in the gate driving circuit. Q_1H represents a change in the potential at the first pull-up node Q in the first row of shift register unit in the gate driving circuit, an Q_2H represents a change in the potential at the first pull-up node Q in the second row of shift register unit in the gate driving circuit. OUT_1H represents a change in the potential at the output terminal OUT in the first row of shift register unit in the gate driving circuit, and OUT_2H represents a change in the potential at the output terminal OUT in the second row of shift register unit in the gate driving circuit.

As shown in FIG. 11, STU represents the display input signal connected to the first row of shift register unit, OE represents a random input signal, and STD represents the display reset control signal connected to the last row of shift register unit.

As shown in FIG. 11, before the shift register unit starts operating, one of the seventh clock signal line CLKM and the eighth clock signal line CLKM is inputted a high-level turn-on signal, and another thereof is inputted a low-level non-turned-on signal. Therefore, at this time, pull-down nodes QB of respective rows of shift registers are maintained in a high-level state, and the first pull-up nodes Q are maintained in a low-level state. When the gate driving circuit starts operating, before the first frame is displayed, the gate driving circuit can receive the initial reset control signal TRST and reset the blanking pull-up control node of respective shift register units in the gate driving circuit by the initial reset sub-circuit.

As shown in FIG. 11, during the display period, respective shift register units connected in cascades output the display output signal progressively. At the same time, during the display period, the random signal input terminal is inputted a high-level turn-on signal at a random moment. According to the structure of gate driving circuit as described above, at the moment of the random signal being inputted, the respective stages of shift registers units without any display output signal being outputted cannot charge the blanking pull-up control node. Only at the moment of the random signal being inputted, the present stage of shift register unit which is outputting the display output signal can charge the blanking pull-up control node by the charging sub-circuit in the blanking input sub-circuit.

During the blanking period, by taking the example as shown in FIG. 11 as an example, since the blanking pull-up control node H of the second row of shift register unit is at a high level, when the second clock signal line CLKB is inputted a high-level pulse, and since the isolation sub-circuit is turned on at the blanking pull-up control node H, thereby the first pull-up node Q can be charged via the isolation sub-circuit. When the fourth clock signal line CLKD is inputted a high-level clock signal, since the first pull-up node Q is in a high-level state, thereby the output transistor is turned on, and the blanking output signal can be outputted via the output terminal.

Before the blanking period ends up, the blanking reset signal can be inputted via the reset control terminal TRST, so that resetting of the blanking pull-up control node and the first pull-up node can be realized.

By utilizing the method as described above, the blanking pull-up signal can be inputted randomly by the blanking input sub-circuit according to the random signal, so that the shift register unit realizes the arbitrarily outputted blanking output signal and realizes random scanning of the gate driving circuit.

Figure 12:
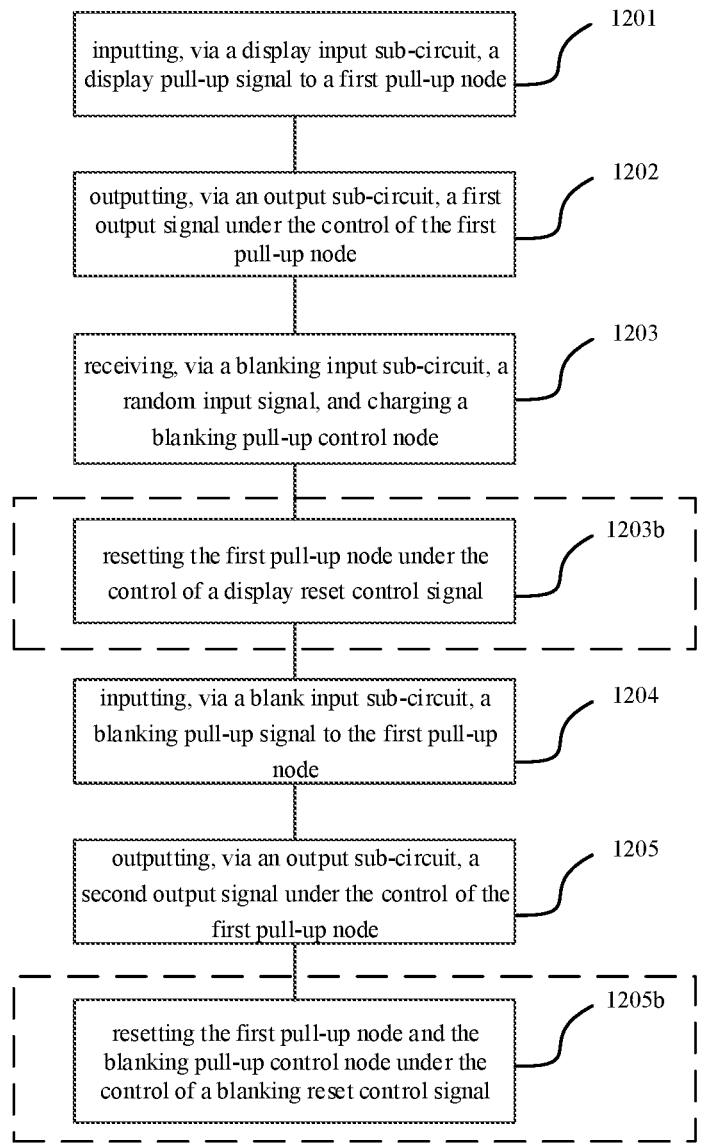
FIG. 12 shows a flow diagram of a driving method applicable to the shift register unit according to some embodiments of the present disclosure.

FIG. 12 shows a flow diagram of a driving method for the shift register unit as described above according to the embodiments of the present disclosure. As shown in FIG. 12, a driving method 1200 can comprise a step of 1201, in a first control phase (also called as "first pull-up phase" in the present disclosure), the display pull-up signal is inputted by the display input sub-circuit to the first pull-up signal. In step 1202, in a first output phase, the first output signal is outputted by the output sub-circuit under the control of the first pull-up node. In step 1203, in the first output phase, the random input signal is received by the blanking input sub-circuit, and the blanking pull-up control node is charged under the control of the random input signal. In step 1204, in a second control phase (also called as "second pull-up phase" in the present disclosure), the blanking pull-up signal is inputted by the blanking input sub-circuit to the first pull-up node. In step 1205, in a second output phase, the second output signal is outputted by the output sub-circuit under the control of the first pull-up node.

In some embodiments, the driving method 1200 can further comprise a step of 1203b, in a display reset phase, the first pull-up node is reset under the control of the display reset control signal.

In some embodiments, the driving method 1200 can further comprise a step of 1205b, in a blanking reset phase, the first pull-up node and/or the blanking pull-up control node is/are reset under the control of the blanking reset control signal.

The driving method for the shift register unit according to the embodiment of the present disclosure can randomly input the blanking pull-up signal to the blanking input sub-circuit according to the random signal, so that the shift register unit realizes the randomly outputted blanking output signal.

There is further provided in at least one embodiment of the present disclosure a display apparatus, comprising the gate driving circuit provided in the embodiment of the present disclosure. The display apparatus can be any product or means having the function of displaying such as a mobile phone, a tablet computer, a television set, a display, a notebook computer, a digital photo frame, a navigator, and so on.

Those skilled in the art can clearly know that embodiments of the present disclosure can be implemented by means of a software and a necessary general hardware, and of course can be implemented by a specific hardware, but the former case is likely to be a preferred implementation in most cases. Based on such understanding, technical solutions of the present disclosure are reflected in substance by a software, a hardware, a firmware or any combination thereof. The computer software product is stored in a readable medium, such as a magnetic storage medium (for example, a hardware) or an electronic storage medium (for example, ROM, flash memory), etc., comprising several instructions for enabling one computer device (it may be a computer, a server or a network device, and so on) to execute the method as described in respective embodiments.

Unless otherwise defined, all the terms (including technical and scientific terms) used herein have same meaning commonly understood by those ordinary skilled in the art. It shall be understood that those terms defined in common dictionaries shall be explained as having meanings consistent with their meanings in the context of relative technology, but shall not be explained as idealized meanings or very formal meanings, unless otherwise explicitly defined herein.

The above are descriptions of the present disclosure, but shall not be deemed as limitations to the present disclosure. Although several exemplary embodiments of the present disclosure are described, it is easy for those skilled in the art to understand that many modifications and amendments can be made to exemplary embodiments without departing from novel teachings and advantages of the present disclosure. Therefore, all these amendments intend to be included within the scope of the present disclosure defined in the Claims. It shall be understood that the above are descriptions of the present disclosure but shall not be deemed as being limited to specific embodiments of the present disclosure. Furthermore, amendments made to the disclosed embodiments and other embodiments intend to be included within the scope of the attached Claims. The present disclosure is defined by the Claims and equivalents thereof.

What is claimed is:

1. A shift register unit, comprising:
    a first input sub-circuit, configured to receive a display input signal from a display input terminal, and input a display output control signal to a first node in a display period of one frame according to the display input signal;
    a second input sub-circuit, configured to receive a random input signal in the display period of one frame, and input a blanking output control signal to the first node in a blanking period of one frame according to the random input signal; and
    an output sub-circuit, configured to output a composite output signal via an output terminal under the control of the first node,
    wherein the second input sub-circuit comprises:
    a charging sub-circuit, configured to charge a blanking control node according to the random input signal, wherein the charging sub-circuit comprises a charging transistor having a first electrode directly connected to the output terminal, a control electrode to which is inputted the random input signal, and a second electrode directly connected to the blanking control node; and
    a storage sub-circuit, connected to the blanking control node and configured to store a blanking control signal according to the random input signal, wherein the storage sub-circuit comprises a first capacitor, having a first terminal directly connected to the blanking control node.

2. The shift register unit according to claim 1, wherein the random input signal is a pulse signal inputted within one random clock cycle during the display period.

3. The shift register unit according to claim 1, wherein the second input sub-circuit further comprises:
    an isolation sub-circuit, configured to input the blanking output control signal to the first node according to the blanking control signal in the blanking period of one frame.

4. The shift register unit according to claim 1, further comprising:
    a display reset sub-circuit, configured to reset the first node under the control of a display reset control signal.

5. The shift register unit according to claim 1, further comprising:

a blanking reset sub-circuit, configured to reset the blanking control node and the first node under the control of a blanking reset control signal before the blanking period of one frame ends up.

6. The shift register unit according to claim 3, wherein the isolation sub-circuit comprises a first isolation transistor and a second isolation transistor, wherein a control terminal of the first isolation transistor is connected to the blanking control node, and a first electrode of the second isolation transistor is connected to a second electrode of the first isolation transistor, a second electrode of the second isolation transistor is connected to the first node, and a control electrode of the second isolation transistor is connected to an isolation control signal line.

7. The shift register unit according to claim 1, wherein the first input sub-circuit comprises a display input transistor, having a first electrode connected to the first node, a second electrode and/or control electrode connected to the display input terminal; and the output sub-circuit comprises an output transistor and an output capacitor, wherein a first electrode of the output transistor is connected to an output clock signal line, a second electrode of the output transistor is connected to the output terminal, and a control electrode of the output transistor is connected to the first node, a first terminal of the output capacitor is connected to the first node, and a second terminal of the output capacitor is connected to the output terminal.

8. The shift register unit according to claim 4, wherein the display reset sub-circuit comprises a display reset transistor, having a first electrode connected to the first node, a control electrode connected to a display reset control terminal, and a second electrode connected to a display reset signal line.

9. The shift register unit according to claim 5, wherein the blanking reset sub-circuit comprises a first blanking reset transistor and a second blanking reset transistor, and wherein a first electrode of the first blanking reset transistor is connected to the blanking control node, a control electrode of the first blanking reset transistor is connected to a blanking reset control terminal, and a second electrode of the first blanking reset transistor is connected to a first blanking reset signal line, and the first blanking reset transistor is configured to reset the blanking control node under the control of the blanking reset control signal; and a first electrode of the second blanking reset transistor is connected to the first node, a control electrode of the second blanking reset transistor is connected to the blanking reset control terminal, and a second electrode of the second blanking reset transistor is connected to a second blanking reset signal line, and the second blanking reset transistor is configured to reset the first node under the control of the blanking reset control signal.

10. A gate driving circuit, comprising N rows of shift register units connected in cascades, each of the shift register units being the shift register unit according to claim 1, wherein a display input terminal of an i-th stage of shift register unit is connected to an output terminal of an (i−1)-th stage of shift register unit, and an output terminal of the i-th stage of shift register unit is connected to a display reset terminal of the (i−1)-th stage of shift register unit, where N is an integer greater than 2, 1<i≤N;

a display input terminal of a first stage of shift register unit is connected to a display signal line; and a display reset control terminal of an N-th stage of shift register unit is connected to a display reset signal line.

11. A display apparatus, comprising the gate driving circuit according to claim 10.

12. The display apparatus according to claim 11, wherein the random input signal is a pulse signal inputted within one random clock cycle during a display period.

13. The display apparatus according to claim 11, wherein the second input sub-circuit comprises:

an isolation sub-circuit, configured to input the blanking output control signal to the first node according to the blanking control signal in the blanking period of one frame.

14. A driving method applicable to the shift register unit according to claim 11, comprising:

during the display period of one frame, in a first control phase, inputting, via the first input sub-circuit, the display output control signal to the first node; and in a first output phase, outputting, via the output sub-circuit, a first output signal under the control of the first node;

wherein in the first output phase, the random input signal is received via the second input sub-circuit, and the blanking control node is charged under the control of the random input signal;

during the blanking period of one frame, in a second control phase, inputting, via the second input sub-circuit, the blanking output control signal to the first node; and in a second output phase, outputting, via the output sub-circuit, a second output signal under the control of the first node.

15. The driving method according to claim 14, wherein the random input signal is a pulse signal inputted within one random clock cycle during a display period.

16. The driving method according to claim 14, further comprising:

in a blanking reset phase, resetting the first node and the blanking control node under the control of a blanking reset control signal.

17. The shift register unit according to claim 3, wherein the isolation sub-circuit comprises an isolation transistor having a control electrode connected to a third clock signal, a first electrode directly connected to the blanking control node, and a second electrode directly connected to the first node, and the isolation transistor is configured to input the blanking control signal to the first node when the third clock signal is input an operating potential.

18. The shift register unit according to claim 3, wherein the isolation sub-circuit comprises:

a first isolation transistor having a control electrode connected to the blanking control node, a first electrode connected to a second clock signal;

a second isolation transistor having a control electrode connected to the second clock signal, a first electrode connected to a second electrode of the first isolation transistor, and a second electrode connected to the first node; and a third isolation transistor connected in series with the first isolation transistor and the second isolation transistor, wherein a control terminal of the third isolation transistor is connected to a first clock signal, wherein the third isolation transistor is used to prevent abnormal output in a next row of shift register unit under control of the first clock signal.

19. The shift register unit according to claim 1, wherein a second terminal of the first capacitor is connected to a second signal line to which is inputted a non-operating potential.

20. The shift register unit according to claim 5, wherein the blanking reset sub-circuit comprises a first blanking reset transistor having a first electrode directly connected to the blanking control node, a second electrode directly connected to a second terminal of the first capacitor and to a second signal line to which is inputted a non-operating potential, and a control electrode connected to the blanking reset control signal, and the first blanking reset transistor is configured to reset the blanking control node under the control of the blanking reset control signal.

* * * * *